United States Patent [19]

Harper

[11] Patent Number: 4,602,239
[45] Date of Patent: Jul. 22, 1986

[54] SPRING TENSIONED WIRE RESISTANCE HEATER
[75] Inventor: J. Cletus Harper, Huntsville, Ala.
[73] Assignee: PPG Industries, Inc., Pittsburgh, Pa.
[21] Appl. No.: 665,903
[22] Filed: Oct. 29, 1984

Related U.S. Application Data
[63] Continuation-in-part of Ser. No. 338,442, Jan. 8, 1982, abandoned.
[51] Int. Cl.[4] ............................................. H01C 10/16
[52] U.S. Cl. .................................... 338/316; 219/541; 219/532
[58] Field of Search ............... 219/216, 375, 388, 532, 219/541; 174/13 BJ; 204/192 E, 192 P, 298; 248/274, 276; 338/316

[56] References Cited
U.S. PATENT DOCUMENTS

| | | | |
|---|---|---|---|
| 2,156,832 | 5/1939 | Ayers | 338/316 X |
| 3,522,415 | 8/1970 | Eisler | 338/316 X |
| 3,649,808 | 3/1972 | Garbe | 338/316 X |
| 3,670,143 | 6/1972 | Zenz | 338/316 X |
| 3,907,660 | 9/1975 | Gillery | 204/298 |
| 3,939,326 | 2/1976 | Hutner | 219/216 |
| 3,971,912 | 7/1976 | Kruger et al. | 219/216 |
| 4,289,598 | 9/1981 | Eagle | 204/192 E |

Primary Examiner—Clarence L. Albritton
Assistant Examiner—M. M. Lateef
Attorney, Agent, or Firm—Donna L. Seidel

[57] ABSTRACT

An apparatus is disclosed for providing uniform radiant heat to a substrate by means of a plurality of parallel electroconductive heating wires which are maintained in planar relationship upon heat expansion by means of attachment to a movable bus bar attached to a tensioned spring, positioned in contact with a stationary member which limits its movement to a plane parallel to the plane of the heating wires.

7 Claims, 5 Drawing Figures

PRIOR ART APPARATUS

SPRING TENSIONED WIRE RESISTANCE HEATER

CROSS-REFERENCE TO RELATED APPLICATION

This application is a continuation-in-part of U.S. application Ser. No. 338,442 filed Jan. 8, 1982 by the same inventor and now abandoned.

BACKGROUND OF THE INVENTION

This invention relates generally to the art of coating a heated substrate and more particularly to the art of radiant heating of a glass substrate for deposition of a coating by vacuum deposition or cathode sputtering.

THE PRIOR ART

U.S. Pat. No. 3,907,660 to Gillery discloses an apparatus for coating glass by cathode sputtering which includes means for radiantly heating the substrate utilizing exposed electroconductive heating wires coupled to a low voltage source. The heating wires are equally spaced from one another and disposed in an area aligned with and extending beyond the area occupied by the substrate to insure a uniform blanket of radiant heat at the substrate surface. Radiant heating is disclosed to be superior to the prior art of heat transfer by conduction. The heating wires are connected at one end to one surface of a bus bar connected to a source of AC voltage and at the other end to one surface of a grounded bus bar. Pivots are connected at one end to the grounded bus bar and at the other end to a grounded expansion spring. The spring loading keeps the heating wires straight and parallel as they expand upon heating during the application of voltage across the bus bars, thereby preventing the wires from sagging and short-circuiting. FIG. 3 illustrates that as the heating wires expand, tension from the spring moves a pivot attached to the end of a support plate, which in turn pivots the bus bar to which the heating wires are attached by means of screws.

SUMMARY OF THE INVENTION

The present invention provides an improved heater wire assembly for use in vacuum deposition or cathode sputtering coating operations. The present invention employs spring tension to keep the heater wires straight and parallel as they expand upon heating, while maintaining the wires in a plane parallel to the substrate to be coated. The heater assembly of the present invention comprises a plurality of uniformly spaced, parallel heater wires lying in a plane. The heater wires are attached at one end to a fixed bus bar and at the other end to a movable bus bar. The movable bus bar is attached to a stationary heater frame by means of support pins affixed to the bus bar and positioned into grooves or slots which form part of the stationary heater frame assembly. The grooves or slots are parallel to the heater wires and permit the bus bar to move in a motion parallel to the heater wires, thereby maintaining the heater wires in spaced parallel relation in a plane parallel to the substrate. Tension on the heater wires is maintained by means of a spring attached at one end to the movable bus bar and at the other end to a stationary part of the coating chamber such as the stationary heater frame. The present invention also provides an improved method for attaching the heater wires to the bus bars by means of a heater wire clamp which comprises a groove wherein the heater wire is held in contact with the bus bar surface. Further improvement in the heater assembly in accordance with the present invention is provided by the addition of heat shields on the ends of the spring in proximity to the heater wires, and by the use of nickel plating on fabricated copper parts such as bus bars, heater wire clamps and power connector spacers.

DETAILED DESCRIPTION OF THE DRAWINGS

Figure 1:
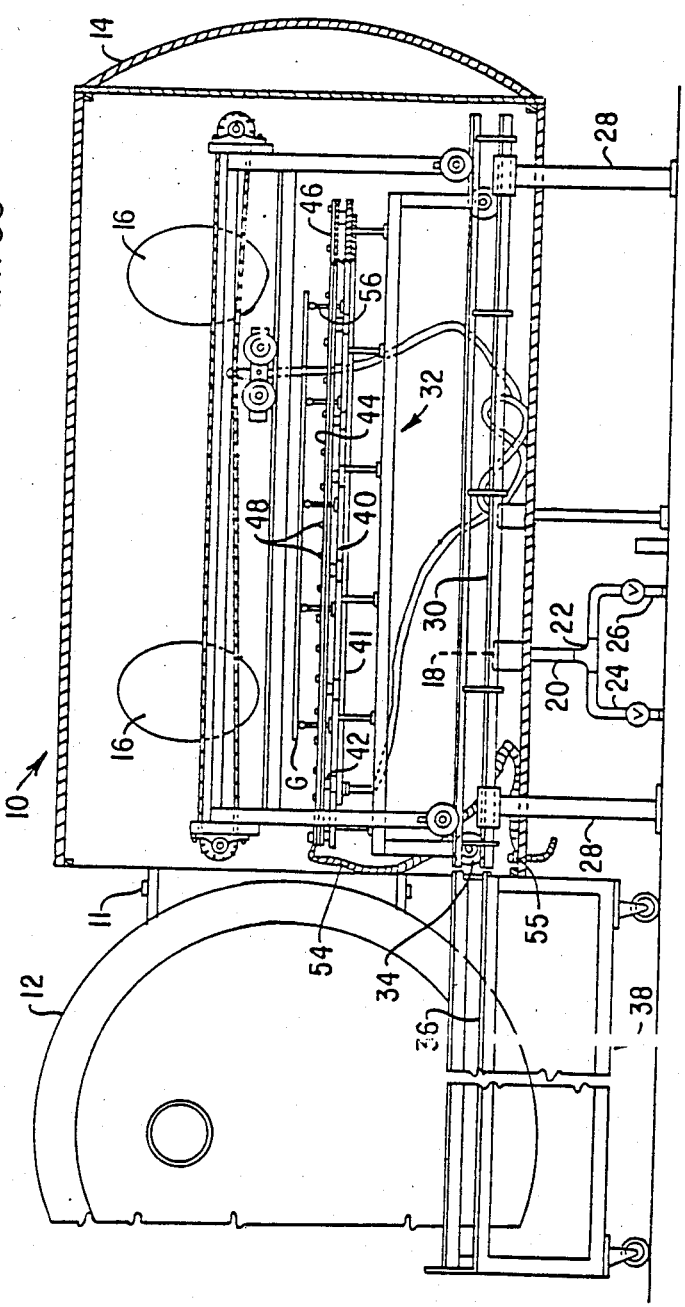
FIG. 1 is a partly schematic side sectional view of a coating apparatus in accordance with the prior art as disclosed in U.S. Pat. No. 3,907,660 to Gillery of the type to which the present invention is an improvement.
Figure 2:
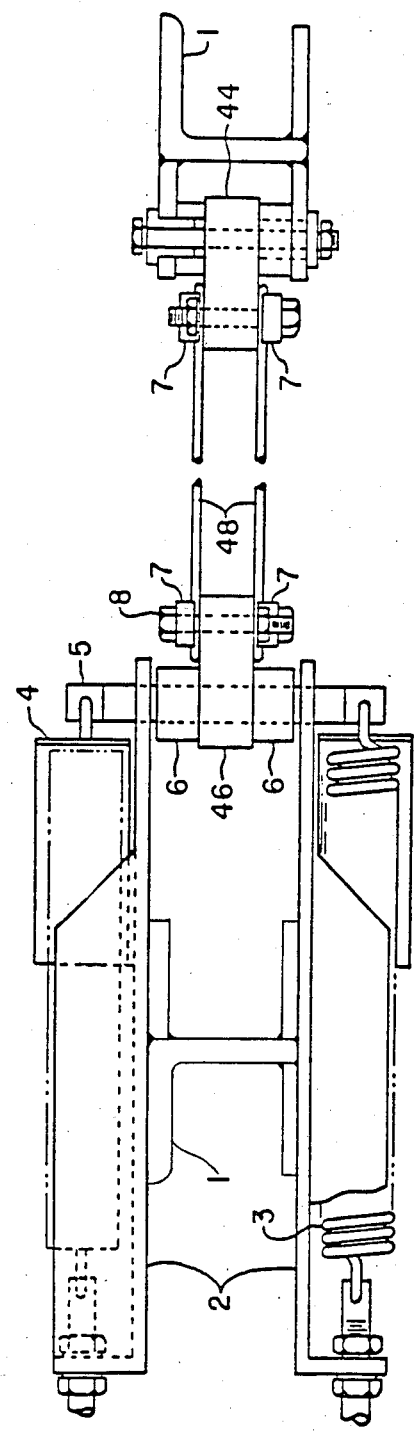
FIG. 2 is an elevated view of the heating wire attachment means of the present invention, an end view normal to the direction of the view of FIG. 1, with portions removed for the purpose of illustration.

FIG. 1 illustrates a typical apparatus for cathode sputtering, as disclosed in FIG. 2 of U.S. Pat. No. 3,907,660 to Gillery, the disclosure of which is incorporated herein by reference. The apparatus comprises a coating chamber 10 having hinges 11 on which a door 12 is pivoted open. Door 14 is closed at the other end. Exhaust openings 16 are connected to a vacuum manifold (not shown). An additional gas supply opening 18 receives a mixed gas supply line 20 extending from a T-connection 22 between gas feed lines 24 and 26 attached to sources of argon and oxygen (not shown). The feed lines 24 and 26 are valved to control inward flow of the respective gases at a metered rate of flow for each gas. Chamber 10 is supported in spaced relation above the ground on vertical posts 28. A lower pair of parallel tracks 30 extends horizontally the length of the coating chamber 10 to receive a heater supporting carriage 32 having rollers 34 that ride on tracks 30 from a position within the cylindrical coating chamber 10 to a lower set of tracks 36 supported on a lowering table 38 disposed outside coating chamber 10. The heater supporting carriage 32 is provided with an anode plate 40 which supports a water cooling system 41 on its lower surface, and a series of spacers 42 of electrical insulating material that support a bus bar 44 in spaced electrically insulated relation to said anode plate on its upper surface. A grounded bus bar 46 extends parallel to bus bar 44. The bus bars 44 and 46 are ½ inch by two inches in cross section and six feet long, and are interconnected at each inch of length by one of a series of parallel heating wires 48. The wires occupy an area aligned with and extending beyond the edges of the substrate to be coated. An insulated power line 54 connects bus bar 44 to a source of AC voltage (not shown) outside chamber 10 through an insulated terminal 55. The voltage source is preferably not more than 50 volts, and the heating wires are preferably nichrome wire. The anode plate supports a series of posts 56 arranged in checkerboard fashion to support the glass sheet during cathode sputtering. The posts 56 are offset with respect to the paths traversed by the parallel heating wires 48 and are of such size that the glass is spaced about two inches from the heating wires. The posts 56 are provided with rounded or pointed heads to minimize the area of contact with the surface while supporting the substrate to be coated.

FIG. 2 shows the heater assembly portion of a coating apparatus in accordance with the present invention in greater detail. Heating wires 48 are attached at one end by means of heater wire clamps 7 to electrical bus bar 44 which is connected by an insulated power line as shown in FIG. 1 to a low voltage source (not shown), and at the other end to movable bus bar 46 which is grounded. Spacers 6 position bus bar 46 between brackets 2 which are welded to stationary heater frame 1. Tensioned springs 3 are attached at one end to stationary brackets 2 and at the other end to support pin 5 which extends through slots in brackets 2 and through spacers 6 and bus bar 46. The springs are protected from the heat radiated by the wires by means of heat shields 4.

Figure 3:
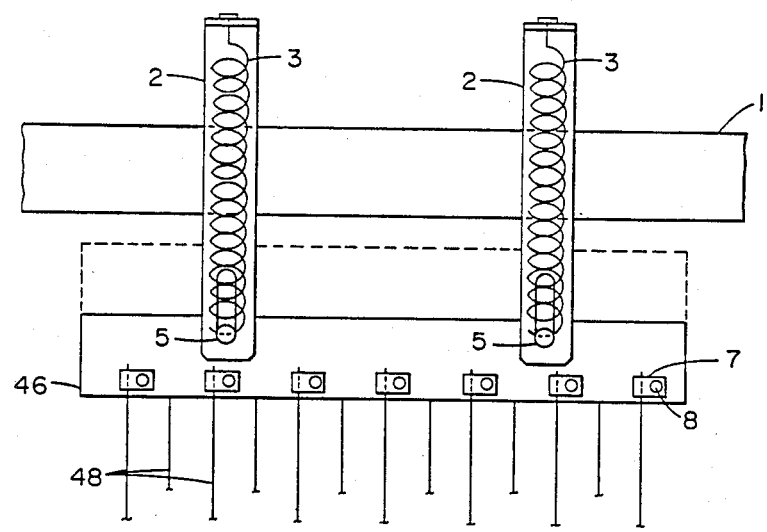
FIG. 3 is a partial top view of the heating wire attachment means of the present invention, normal to the directions of the view of FIGS. 1 and 2, illustrating the initial position of the movable bus bar and, in broken lines, its path of movement.

FIG. 3 illustrates slotted brackets 2, mounted on frame 1 defining the path of travel of pin 5 as the movable bus bar moves in the path indicated by the broken lines in response to tension on springs 3 upon heating and expansion of heater wires 48 which are shown alternately on opposite sides of movable bus bar 46 held in place by means of wire clamps 7 secured by bolts 8.

Figure 4:
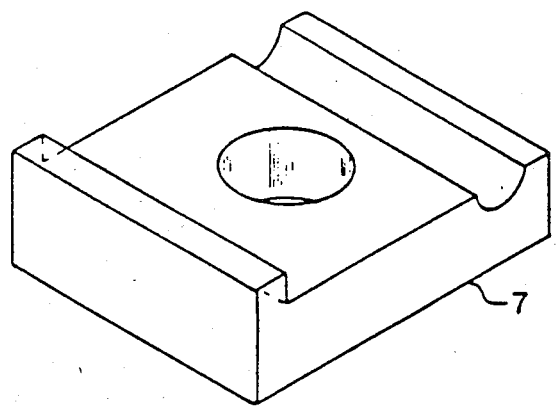
FIG. 4 is an isometric view of the heating wire clamp of the present invention.
Figure 5:
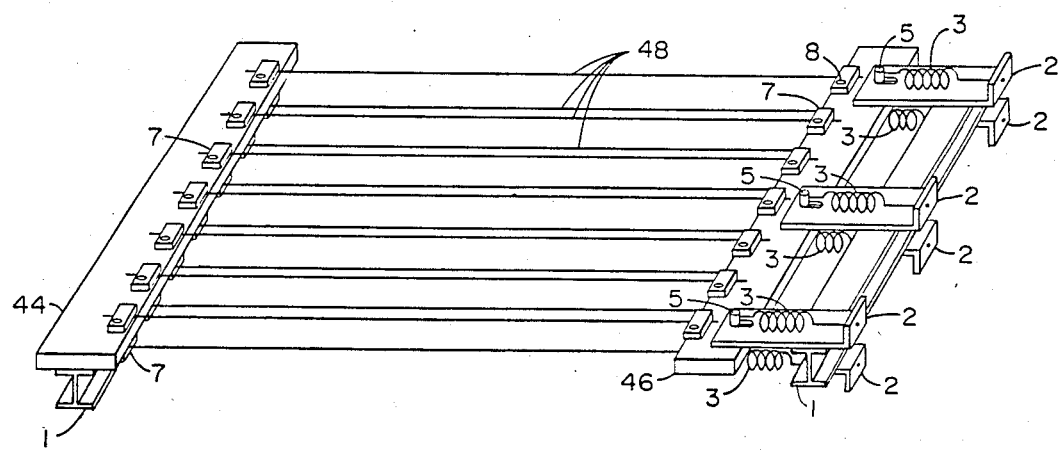
FIG. 5 is an isometric view of the heating wire and bus bar attachment means of the present invention.

FIG. 4 illustrates the heater clamp 7 comprising a groove for heater wire 48 and a hole for securing bolt 8 shown in FIG. 2. FIG. 5 illustrates the stationary bus bar 44 and the movable bus bar 46 which is attached to a stationary frame 1 by means of springs 3 in a state of tension. Heater wires 48 are attached alternately on opposite sides of bus bars 44 and 46 and are held in place by means of wire clamps 7 which are affixed to the bus bars 44 and 46 by means of bolts 8.

DETAILED DESCRIPTION OF THE PREFERRED EMBODIMENTS

A radiant heater for heating a substrate to be coated by cathode sputtering or vacuum deposition comprises exposed electroconductive heater wires electrically coupled to a low voltage source. The heater wires are preferably equally spaced from one another and disposed over an area aligned with and extending beyond the area occupied by the substrate to insure a uniform blanket of radiant heat at the substrate. The heater wires are connected at one end to a fixed electrical bus bar connected to low voltage, high current power connectors, and insulated from the grounded metal heater frame to which it is attached. The other end of each heater wire is connected to a movable bus bar to which the grounding conductors are connected. The movable bus bar is affixed to the grounded metal heater frame by means of support pins, preferably made of stainless steel, which pass through the bus bar and are positioned in a groove or slot in a support bracket which is welded onto the heater frame. This design permits the bus bar to move freely in a plane of motion parallel to the plane of the heater wires within the limits provided by the groove or slot in the support bracket. The heater wires, which expand upon heating, are maintained in parallel spaced relationship by means of spring loading on the movable bus bar. Tension on the movable bus bar is supplied by means of springs affixed at one end to the movable bus bar and at the other end to a stationary component of the coating chamber such as the stationary heater frame. Tension and extension length of the spring are sufficient to accommodate the maximum heater wire expansion caused by application of electrical power to heat the wires, in order to prevent sagging and short-circuiting of the wires. In preferred embodiments of the present invention, the plurality of heater wires form two planes, one plane parallel with one major surface of the electrical bus bar and the other plane parallel with the opposite parallel surface of the movable bus bar. The individual heater wires are attached alternately to opposite surfaces of the bus bars in order to provide uniformity so that the movable bus bar moves in a motion parallel to the two planes formed by the two sets of heater wires. Likewise, the springs which provide tension to maintain the heater wires in uniform parallel distribution are placed on opposite sides of the movable bus bar in pairs so that the tension provided by the springs is equally distributed to both major surfaces of the bus bars to which the heater wires are attached.

The useful life of the springs is improved by the addition of radiant heat shields, preferably reflective stainless steel sleeves, on the ends of the springs in close proximity to the heater wires. Heater wire life and efficiency are improved by use of a heater wire clamp which comprises a groove wherein the heater wire is held in contact with the bus bars. The heater wire clamp of the present invention provides uniform force over a larger area of the heater wire in order to prevent breakage of the wire, such as experienced when the wire is held in place by means of point contact from a screw.

In addition to improving the performance and lifetime of the heater wire, the heater wire clamp of the present invention also facilitates heater wire replacement since the clamp may be simply loosened and a new heater wire inserted in the groove. By comparison, heater wire replacement in an apparatus wherein the heater wires are inserted into a hole drilled through the bus bar and held in place by means of a screw inserted through a perpendicular hole drilled through the bus bar may require drilling out of the hole to remove the old heater wire and make a space for insertion of the new one. The heater wire clamps of the present invention are preferably copper plated with nickel to prevent corrosion and oxidation. Preferably, other fabricated copper parts, such as the bus bars and power connector spacers, are also nickel plated to prevent corrosion and oxidation. The apparatus of the present invention is preferably employed in a cathode sputtering coating operation such as the deposition of tin and/or indium oxide on glass plates, as described in U.S. Pat. No. 3,907,660 and 4,094,763, the disclosures of which are incorporated herein by reference.

In a preferred embodiment of the present invention, the radiant heater wires, glass substrates and cathode are in a vertical orientation. A fixed electrical bus bar on one side of a heater assembly is connected to a low voltage, high current power source. The bus bar is mounted on a grounded metal heater frame but insulated and electrically isolated therefrom. Nichrome 10 gauge heater wires are connected at one end to the fixed electrical bus bar and at the other end to a movable electrical bus bar, to which are connected the grounding conductors. The movable bus bar is affixed to the grounded metal heater frame by means of a plurality of cylindrical stainless steel support pins which pass through the bus bar and are positioned into slots in support brackets which are welded onto the metal heater frame. The design of the slots in the brackets permits the bus bar to move in a motion parallel with the plane of the heater wires within the limits provided by the slot in the support bracket. The heater wires are properly tensioned by means of springs affixed at one end to the support brackets on the heater frame and at the opposite end to the stainless steel support pins. One spring is attached at either end of each support pin to provide uniform tension on the movable bus bar. The springs are extended after attachment to achieve sufficient extension length and tension to accommodate the maximum heater wire expansion obtained in a particular coating operation. In addition, the heater wires are placed such that alternating wires are attached to opposite surfaces of the bus bars in order to insure uniform parallel movement of the movable bus bar.

The spring tensioned electroconductive wire heater design of the present invention increases the efficiency of supplying adequate amounts of energy uniformly to a substrate for radiant heating by maintaining good contact between the heater wires and bus bars by means of the heater wire clamps, and by maintaining heater wire expansion in a plane parallel with the substrate to be coated; extends heater wire life by spreading the force holding the heater wire in place over a larger area and by avoiding pivoting motions on the bus bars; and minimizes equipment downtime caused by heater wire breakage by facilitating replacement of heater wires. These various advantages are related to the heater wire clamp design of the present invention which provides uniform contact between the heater wire and the bus bar surface, thereby improving the efficient performance of the heater wire and minimizing damage or breakage caused by pressure and metallic interaction at the point of contact in a screw-to-wire type connection, and to the parallel range of motion of the movable bus bar defined by the slotted or grooved support bracket.

The present invention will be further understood from the description of a specific example which follows.

EXAMPLE I

The heater assembly described above is used for the radiant heating of a glass substrate in a cathode sputtering chamber for the deposition of an indium-tin oxide film. A nickel plated copper bus bar approximately $\frac{3}{4}$ by two inches (about 1.9 by 5.1 centimeters) in cross-section and about two feet (about 0.6 meter) long is connected to an AC power source supplying to about 30 volts. Nichrome heating wires are attached at one end to the fixed electrical bus bar and at the other end to a movable nickel plated copper bus bar. Alternate heating wires, preferably 10 gauge nichrome heating wires about 150 inches (about 3.8 meters) long, are attached to opposite surfaces of the bus bars. In the course of heating to typical temperatures of about 700° to 1000° F. (about 371° to 538° C.), heater wires of this length typically expand about $1\frac{1}{2}$ to two inches (about 3.8 to 5.1 centimeters). As the heating wires expand, the movable bus bar moves along the slot in the mounting bracket in response to tension on the springs. The springs are preferably one inch (2.54 centimeters) outside diameter, five inches (about 12.7 centimeters) overall length with $3\frac{1}{3}$ inches (about 8.5 centimeters) coil length and made of 0.148 steel wire. The heater wires are preferably attached to the bus bars by means of nickel plated copper clamps with grooves that hold the wires in contact with the surface of the bus bar. Heater wire life in the apparatus of the present invention is typically three to six months compared with heater wire life of four to eight weeks when heater wires are mounted by means of holes and screws to a pivoting bus bar as shown in the cited references.

The above example illustrates the present invention, the scope of which is defined by the following claims.

I claim:

1. In an apparatus for heating a substrate comprising a plurality of electroconductive heating wires in substantially parallel, spaced relationship attached at one end to a bus bar capable of connection to a voltage source and at the other end to a bus bar capable of being grounded, wherein one of the bus bars is attached to a tensioned spring to prevent sagging of the wires as the wires expand upon heating, the improvement which comprises attaching said spring in a state of tension at one end to a stationary member of the apparatus and at the other end to a bus bar which is movable in a plane parallel with the plane of said heating wires and is positioned in contact with a stationary member of the apparatus which limits its movement to said plane.

2. The improved apparatus according to claim 1, wherein said movable bus bar is positioned by means of a support pin which passes through said bus bar and through slots in said stationary member.

3. The improved apparatus according to claim 2, wherein each end of said support pin is attached to one end of a separate spring, the other end of which spring is attached to a stationary support member.

4. The improved apparatus according to claim 3, wherein alternate heating wires in said apparatus are attached to opposite surfaces of said bus bars.

5. The improved apparatus according to claim 1, wherein said heating wires are attached to said bus bars by means of clamps comprising grooves, wherein said wires are held in contact with the surfaces of said bus bars.

6. The improved apparatus according to claim 5, wherein said clamp is copper plated with nickel.

7. The improved apparatus according to claim 1, wherein said spring is covered with heat shield.

* * * * *